(12) United States Patent
Chou et al.

(10) Patent No.: US 8,298,838 B2
(45) Date of Patent: Oct. 30, 2012

(54) METHOD FOR STAINING SAMPLE

(75) Inventors: Po-Fu Chou, Taoyuan County (TW); Yu-Wen Liu, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 359 days.

(21) Appl. No.: 12/712,133

(22) Filed: Feb. 24, 2010

(65) Prior Publication Data
US 2011/0204356 A1     Aug. 25, 2011

(51) Int. Cl.
*G01R 31/26*  (2006.01)
*H01L 21/66*  (2006.01)

(52) U.S. Cl. .................... 438/17; 257/E21.53
(58) Field of Classification Search ............ 438/700, 438/739, 738, 735, 12–17; 257/E21.521, 257/E21.524, E21.527, E21.528, E21.529, 257/E21.53, E21.531, 48
See application file for complete search history.

(56) References Cited

U.S. PATENT DOCUMENTS

| | | | | |
|---|---|---|---|---|
| 5,403,753 A * | 4/1995 | Huber et al. | ............... | 438/16 |
| 5,520,769 A * | 5/1996 | Barrett et al. | ............... | 438/14 |
| 5,652,151 A * | 7/1997 | Asada | ............... | 438/18 |
| 5,656,509 A * | 8/1997 | Liu | ............... | 438/18 |
| 5,851,925 A | 12/1998 | Beh | | |
| 6,320,403 B1 * | 11/2001 | Shabde et al. | ............ | 324/754.27 |
| 6,395,437 B1 * | 5/2002 | Wollesen | ............... | 430/30 |
| 6,428,718 B1 * | 8/2002 | Birdsley et al. | ............... | 216/84 |
| 6,507,044 B1 * | 1/2003 | Santana et al. | ............... | 257/48 |
| 6,664,797 B1 * | 12/2003 | Wollesen | ............ | 324/754.22 |
| 6,812,049 B1 * | 11/2004 | Tracy | ............... | 438/17 |
| 7,355,173 B2 | 4/2008 | Kuan | | |
| 7,812,347 B2 * | 10/2010 | Banke et al. | ............... | 257/48 |
| 2006/0270067 A1 * | 11/2006 | Lin | ............... | 438/5 |
| 2009/0256207 A1 * | 10/2009 | Chen et al. | ............... | 257/365 |
| 2010/0015735 A1 * | 1/2010 | Hsieh et al. | ............... | 438/16 |
| 2010/0244870 A1 * | 9/2010 | Tanbakuchi et al. | ............... | 324/754 |

* cited by examiner

*Primary Examiner* — Matthew Landau
*Assistant Examiner* — Latanya N Crawford
(74) *Attorney, Agent, or Firm* — Winston Hsu; Scott Margo

(57) ABSTRACT

A method for staining a sample includes the following steps. A test device is provided. The test device is sampled to obtain a sample. The sample includes a substrate, an active area disposed within the substrate and having a first doped substrate region and a second doped substrate region, at least one gate disposed between the first doped substrate region and the second doped substrate region, and an exposed shallow trench isolation embedded in the substrate and surrounding the active area. A first staining procedure is then carried out to selectively remove the shallow trench isolation to form a first void and to entirely expose the active area. A second staining procedure is subsequently carried out to selectively stain the first doped substrate region and the second doped substrate region to form a second void.

15 Claims, 9 Drawing Sheets

METHOD FOR STAINING SAMPLE

BACKGROUND OF THE INVENTION

1. Field of the Invention

The present invention generally relates to a method for staining a sample as well as a sample cross-section which is obtained from sampling a test device in a special way. In particular, the present invention is directed to a method for staining a sample by means of two independent staining procedures as well as a sample cross-section obtained thereby.

2. Description of the Prior Art

Integrated circuits are essential components of various electronic products such as micro-electro-mechanical devices (MEMS), CPUs, processors, memories, and so on. Integrated circuits are usually fabricated by standard semiconductor processes involving silicon wafer fabrication techniques.

A standard semiconductor process usually involves many procedures, such as deposition, lithography, etching, chemical and mechanical polishing and implantation . . . etc. After the procedures, the integrated circuits have to be subjected to various tests to ensure that the fabrication procedures have produced operative devices. There may be many reasons why a device does not operate correctly. One of these could be a failure in the device itself due to procedure reasons. If the failure is found to be in the device and recurs frequently in devices made by the same procedure, this could indicate that this manufacturing procedure needs to be further adjusted in order to correct or prevent the errors.

For example, doping regions are expected to form within the substrate and develop a correct profile, providing the semiconductor wafer has been subject to an ion implantation procedure to construct such doping regions. One cause of failure in a device can occur in the doping profile of a substrate which has been subject to an implantation procedure. The doping profile in the substrate deviates from where it is required, which can lead to current leakage and at the same time cause the device to malfunction. For example, the junction profile in an SRAM device, and especially the junction profile of the active area (AA) in a PMOS, is of great interest since the shape of the active area (AA) in the PMOS of an SRAM device may be irregular: a curved shape for instance.

Because the junction profile should be formed within the substrate and surrounded by a less-doped substrate, an incorrect doping profile of the substrate cannot be easily detected using microscopy as different doping profiles in the substrate provide no contrast to the surrounding substrate and therefore cannot be visually distinguished.

One current method which is widely used to visualize the substrate implantation defects is to cut a piece of sample from the device. FIG. 1 illustrates how a piece of sample is cut along the line A-A in order to expose the junction profile in the conventional method. The device 10 is illustrated as an SRAM. The device 10 has a PMOS region 11 and an NMOS region 12. Please note that the active area 13 of the PMOS region 11 has a croissant shape, compared with the NMOS region 12.

Later, the sample is subject to a staining procedure to stain the target regions, i.e. the doped regions, by means of a single chemical solution. This is called a junction delineation or junction stain, which delineates areas with different doping levels so as to make the fail sites visible. Staining delineates the various layers and provides better contrast for examining the device using an SEM (Scanning Electron Microscope).

Since the chemical solution is so formulated to focus on the target regions only, the sample must be overcut into the entire active area 13 so that the junction profile within the active area 13 can be totally exposed. Line A-A in FIG. 1 indicates the overcut of the sample to totally expose the junction profile within the active area 13.

Because the critical dimension of the device 10 is downsized, the area of the active area 13 is downsized too, which makes it increasingly hard to obtain a correctly cut and stained sample; in particular, for the active area 13 of the PMOS region 11 of the croissant shape. In view of the above, it is understood that the conventional junction staining method suffers from a controllability problem since the extent of overcut is critical. If it is undercut, the junction profile within the active area 10 cannot be totally exposed, and the chemical solution is therefore not able to develop a good stain profile. If it is too overcut, however, there would be an insufficient junction profile left for the staining procedure. Furthermore, it is also very difficult to obtain a sample which is neither undercut nor too overcut. As a result, a novel method is still needed for staining a sample to overcome the aforesaid problems.

SUMMARY OF THE INVENTION

The present invention therefore proposes a novel method for staining a sample. In the method of the present invention, the overcut/undercut issue is no longer a problem. Accordingly, a sample with a good stain profile can easily be prepared after the staining procedure.

The present invention proposes a method for staining a sample. First, a test device is provided. Second, the test device is sampled to obtain a sample. The sample includes a substrate, an exposed shallow trench isolation embedded in the substrate, an active area disposed within the exposed shallow trench isolation and having a first doped substrate region and a second doped substrate region, and at least one gate disposed between the first doped substrate region and the second doped substrate region. Later, a first staining procedure is carried out to selectively remove the shallow trench isolation to form a first void and to at least partially expose the active area. Afterwards, a second staining procedure is carried out to selectively stain the first doped substrate region and the second doped substrate region to form a second void. The first void and the second void connect to each other.

The present invention also proposes a sample cross-section which is obtained from sampling a test device. The sample cross-section includes a substrate region, an active area, a first void and a second void. The active area is disposed on the substrate region. There is at least one gate disposed on the active area. The first void is recessed in the substrate region and surrounds the active area. The second void is recessed in the active area and surrounds the gate.

The present invention again proposes a sample cross-section which is obtained from sampling a test device. The sample cross-section includes a substrate region, a shallow trench isolation, an active area, at least one gate and an interlayer dielectric layer. The shallow trench isolation is disposed on the substrate region. The active area is disposed within the shallow trench isolation. The gate is disposed on the active area. The interlayer dielectric layer completely covers the shallow trench isolation, the active area and the at least one gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
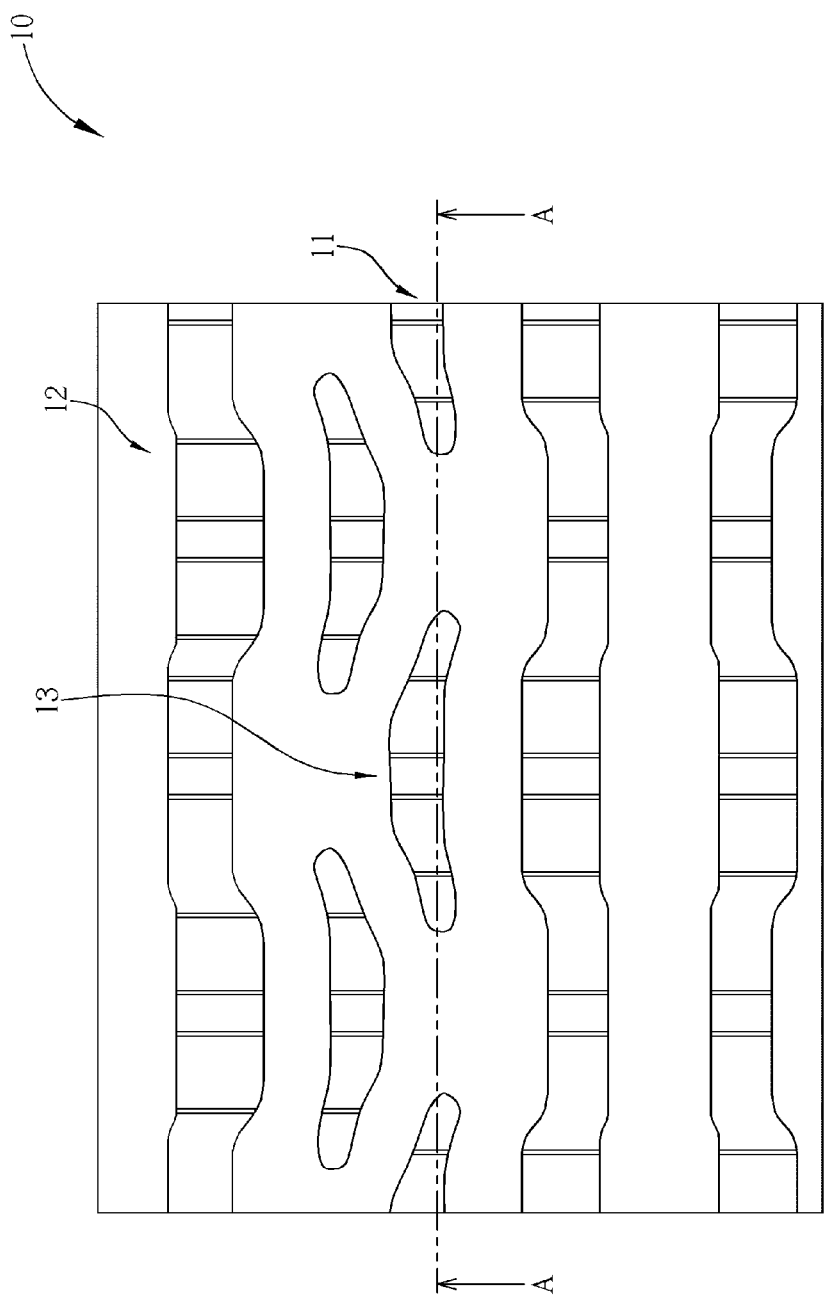
FIG. 1 illustrates how a piece of sample is cut in order to exposes the junction profile in the conventional method.
Figure 2:
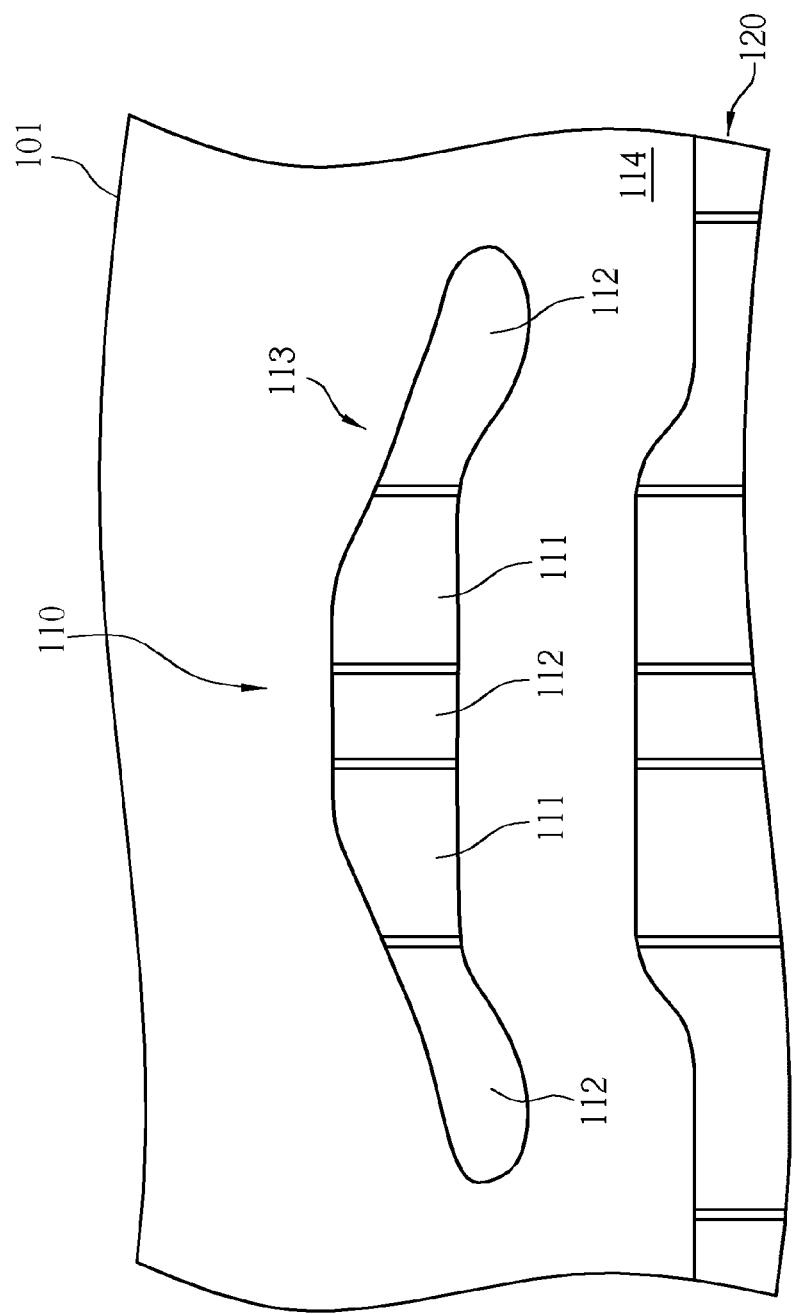
FIGS. 2-5 illustrate the method of the present invention for staining a sample.

The present invention first provides a method for staining a sample. The method of the present invention uses a double staining process so that a sample with a good stain profile can be easily prepared after the double staining procedure. In addition, there is no need to overcut the device to obtain a sample.

FIGS. 2-5 illustrate the method of the present invention for staining a sample. Please refer to FIG. 2, which illustrates a top view of a test device. First, the test device 101 is provided. The test device 101, such as an SRAM, may be fabricated by a standard semiconductor process. The test device 101 includes integrated circuits such as PMOS 110 and NMOS 120. The PMOS 110 includes at least a gate region 111 and a source/drain region 112, which collectively define an active area (AA) 113. The source/drain region 112 is usually a doped region within the substrate 115 so each source/drain region 112 has a unique junction profile defined by the dopant within. The gate regions 111 usually bulge from the active area (AA) 113. The substrate 115 is usually a semiconductive material, such as Si.

The test device 101 is then particularly sampled to obtain a sample 102. Please refer to FIG. 3A, which illustrates a top view of the sample 102 from the test device 101. The sample 102 may be obtained by cutting the test device 101 along Line B-B or Line C-C. Please note that neither Line B-B nor Line C-C overcuts the sample 102. In other words, the sample 102 may be obtained by cutting the test device 101 without substantially exposing the active area (AA) 113, i.e. the source/drain region 112. The sample 102 may also be obtained by cutting the test device 101 with the active area (AA) 113, i.e. the source/drain region 112, being exposed; that is, the sample 102 may also be overcut. The test device 101 may be sampled through various approaches. For example, sampling the test device 101 may be carried out by an ion beam cutting, by polishing the test device 101 or by cleaving the test device 101.

Figure 3A:
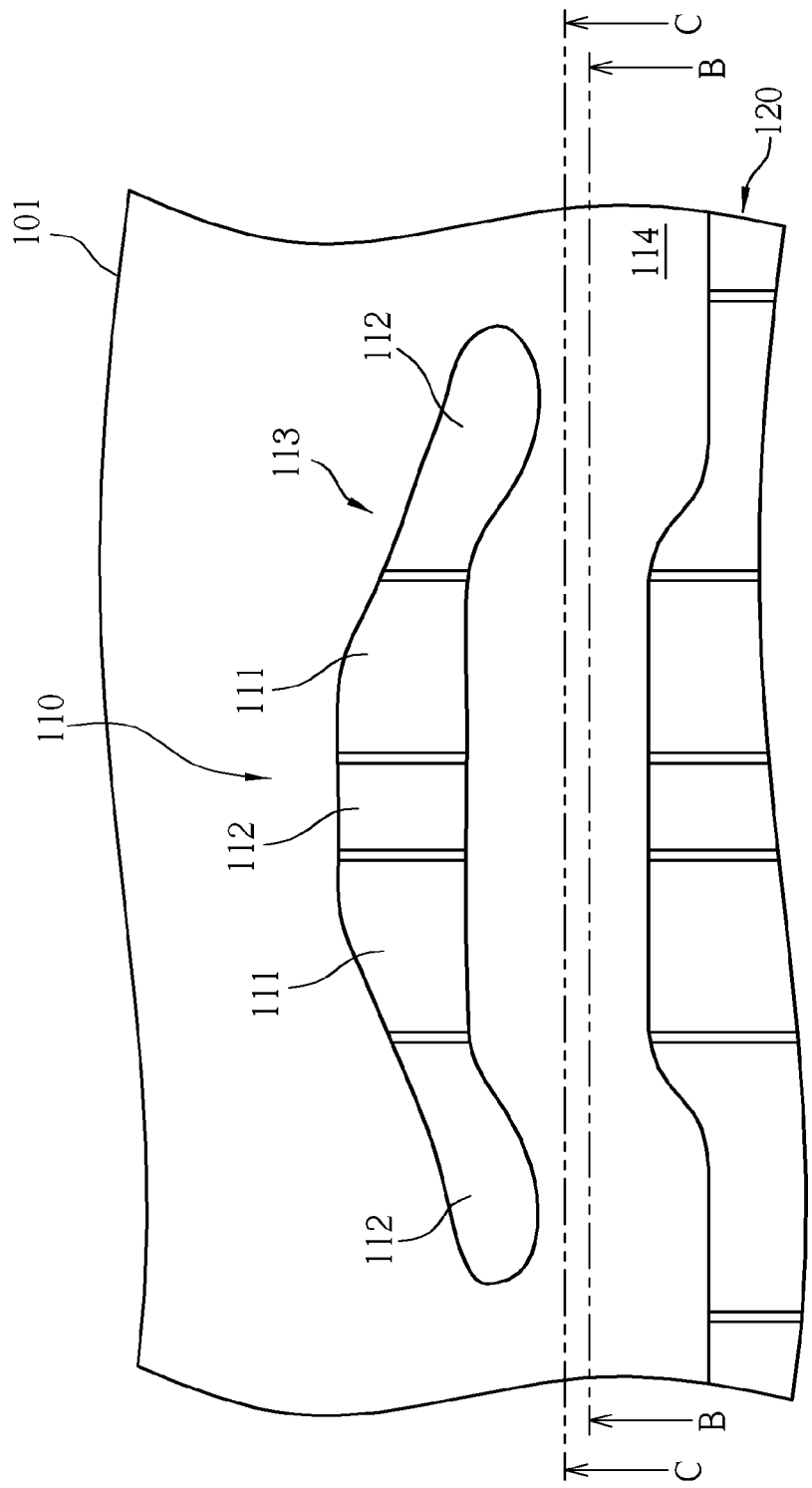
Figure 3B:
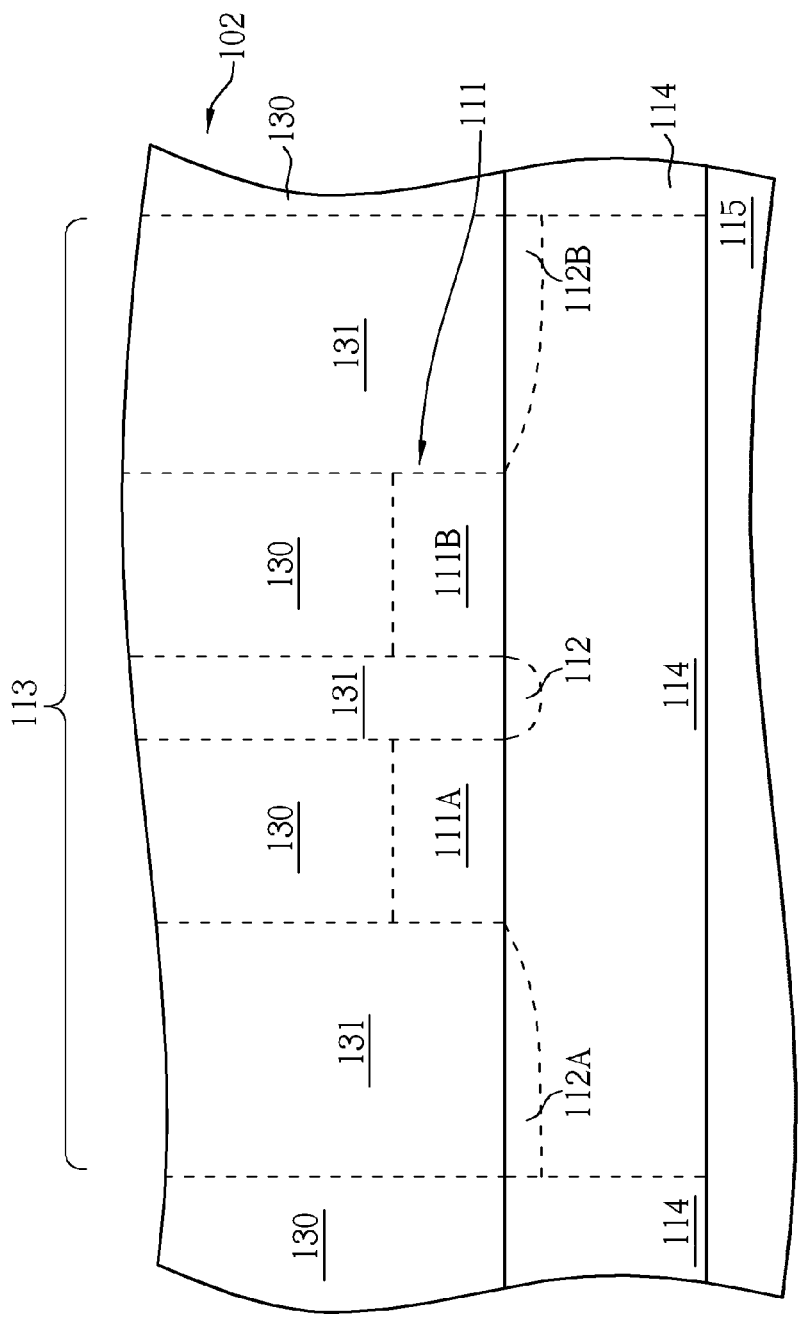

Please refer to FIG. 3B, which illustrates a side view of the sample 102 in accordance with Line B-B as shown in FIG. 3A. The sample 102 includes a substrate 115, an active area 113, and an exposed shallow trench isolation 114. The shallow trench isolation 114 may be embedded in or disposed on the substrate 115. The active area 113 is disposed within the shallow trench isolation 114 and has a first doped substrate region 112 A, a second doped substrate region 112 B. At least one gate region 111 bulges from the active area (AA) 113. The first doped substrate region 112 A and the second doped substrate region 112 B are respectively the source/drain region 112 as described above and disposed adjacent to the gate region 111. On the active area 113 there may be more than one gate 111A/111B within the gate region 111, as shown in FIG. 3B, so that the gate region 111 is disposed between the first doped substrate region 112 A and the second doped substrate region 112B. Furthermore, the shallow trench isolation 114 entirely surrounds the active area 113.

Figure 3C:
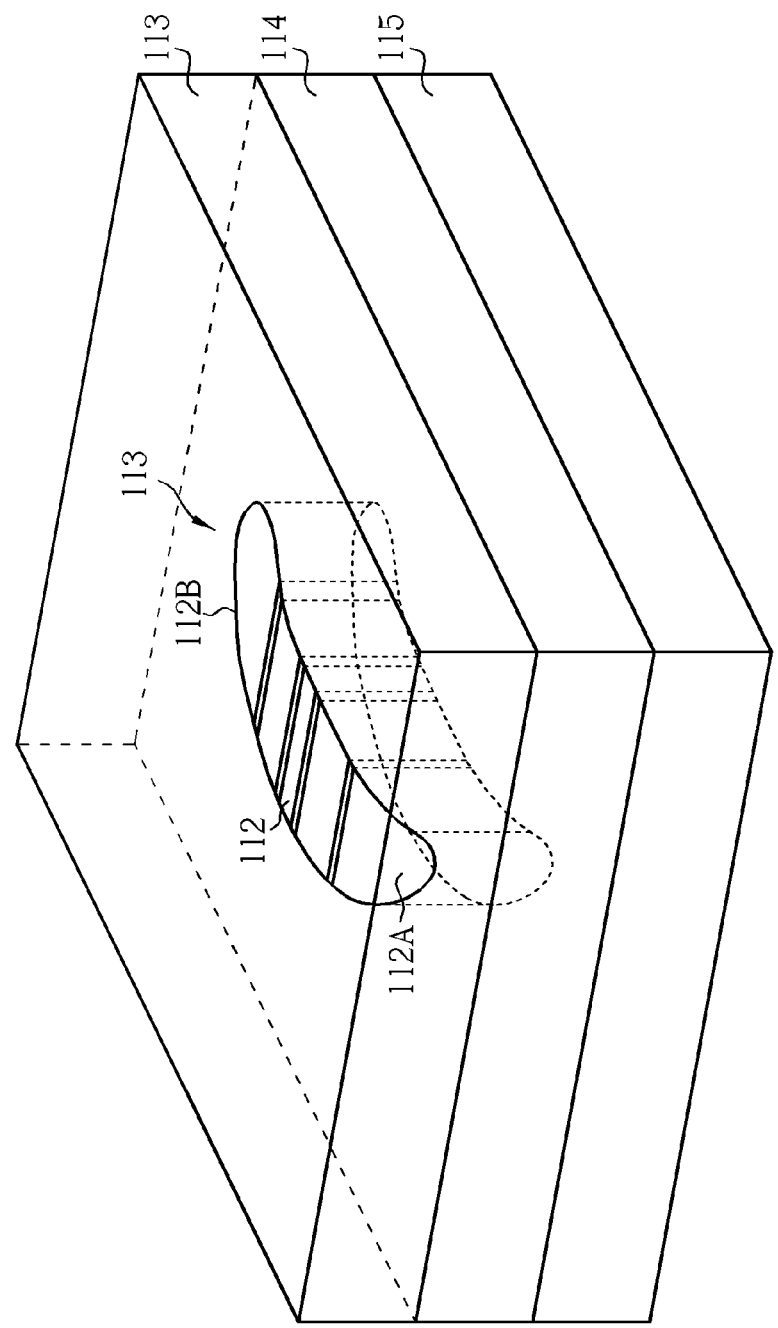

The shallow trench isolation 114 which is embedded in or disposed on the substrate 115 and surrounds the active area 113 is exposed at this point because of the Line B-B. Additionally, there may be a metal connection 131 electrically connecting to the gates 111A/111B and an interlayer dielectric layer 130 covering the first doped substrate region 112 A, the second doped substrate region 112 B, the gate region 111 and the shallow trench isolation 114, and surrounding the metal connection 131. In other words, the interlayer dielectric layer 130 completely covers the shallow trench isolation 114, the active area 113 and the gate region 111 and surrounds the metal connection 131. FIG. 3C illustrates a perspective view of FIG. 3B. For the convenience of illustration, some of the elements are not shown.

Figure 4A:
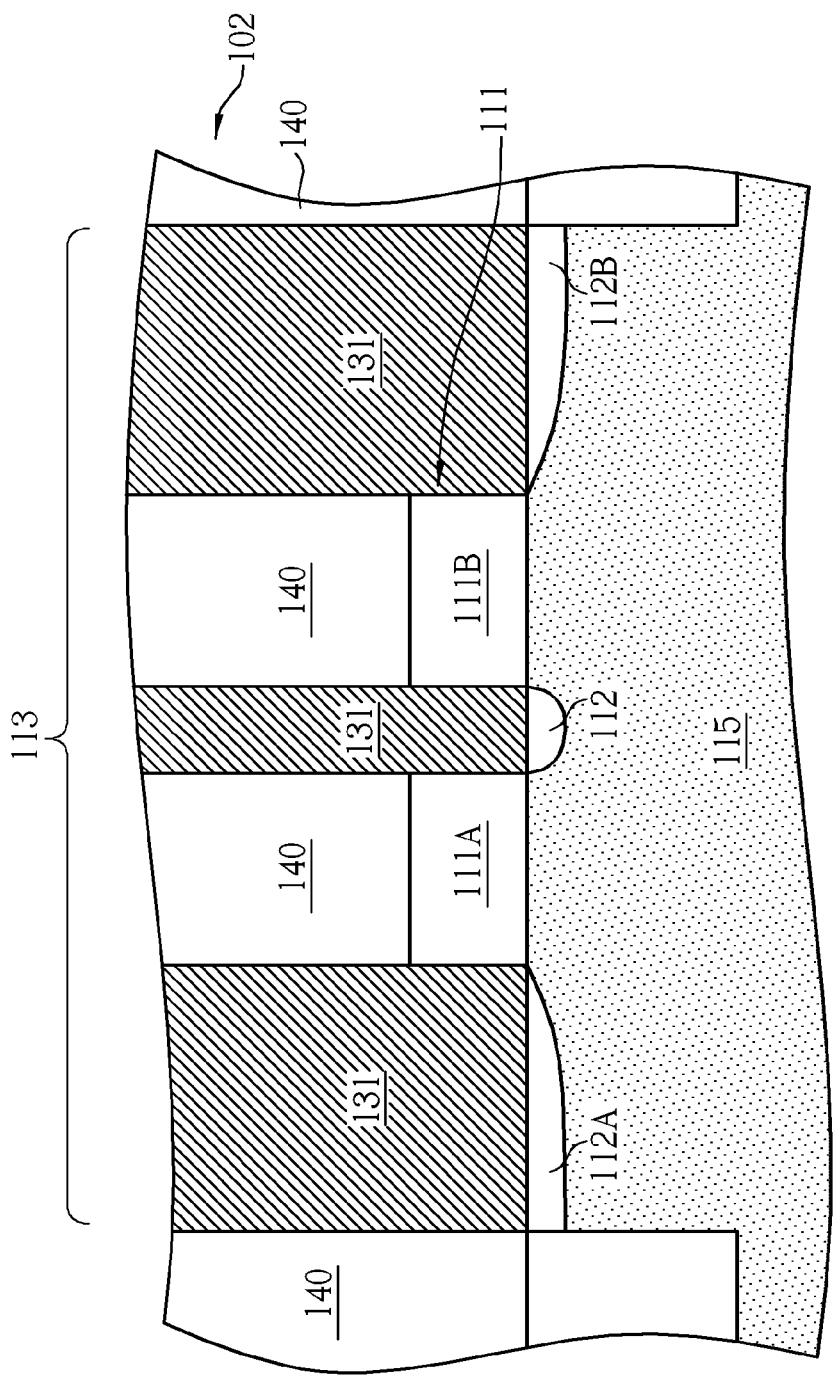

Please refer to FIG. 4A. FIG. 4A illustrates a first staining procedure being carried out to expose the diffusion area. The first staining procedure is focused on selectively removing the silicon oxide material, such as the shallow trench isolation 114 and the interlayer dielectric layer 130. After the first staining procedure, a first void 140 is formed as a result and, at the same time, the active area 113 and the metal connection 131 are entirely or at least partially exposed. In other words, the active area 113 and the metal connection 131 now may be surrounded by the first void 140. However, the junction profile, i.e. the doped substrate regions 112/112A/112B within the active area 103 also called the diffusion area, remains substantially intact but exposed.

Figure 4B:
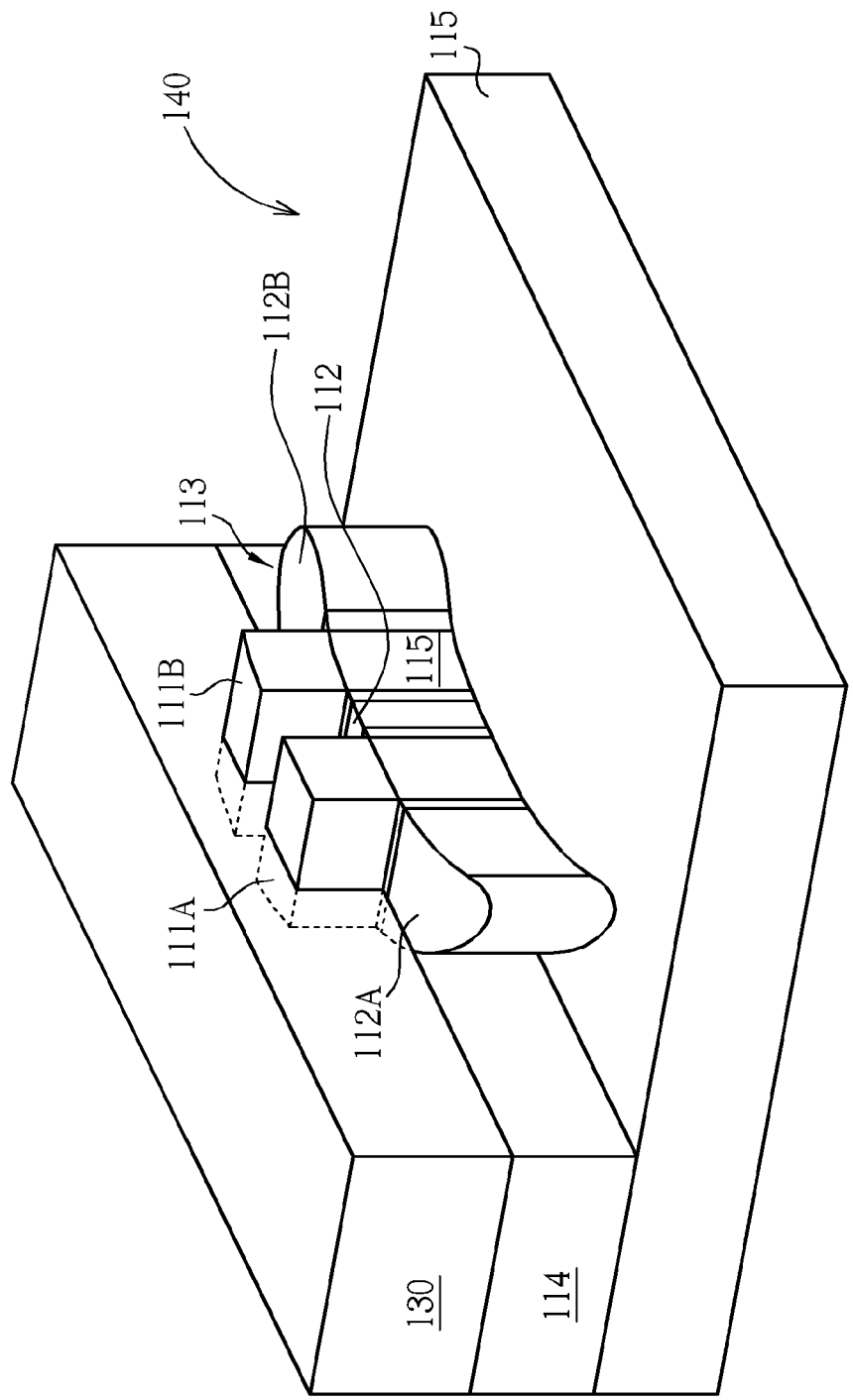

FIG. 4B illustrates a perspective view of FIG. 4A. For the convenience of illustration, some of the elements are not shown. The first staining procedure may employ a chemical solution which is a fluoro-containing etchant and has high etching selectivity such as BOE (or PAD solution) or an HF solution.

Figure 5:
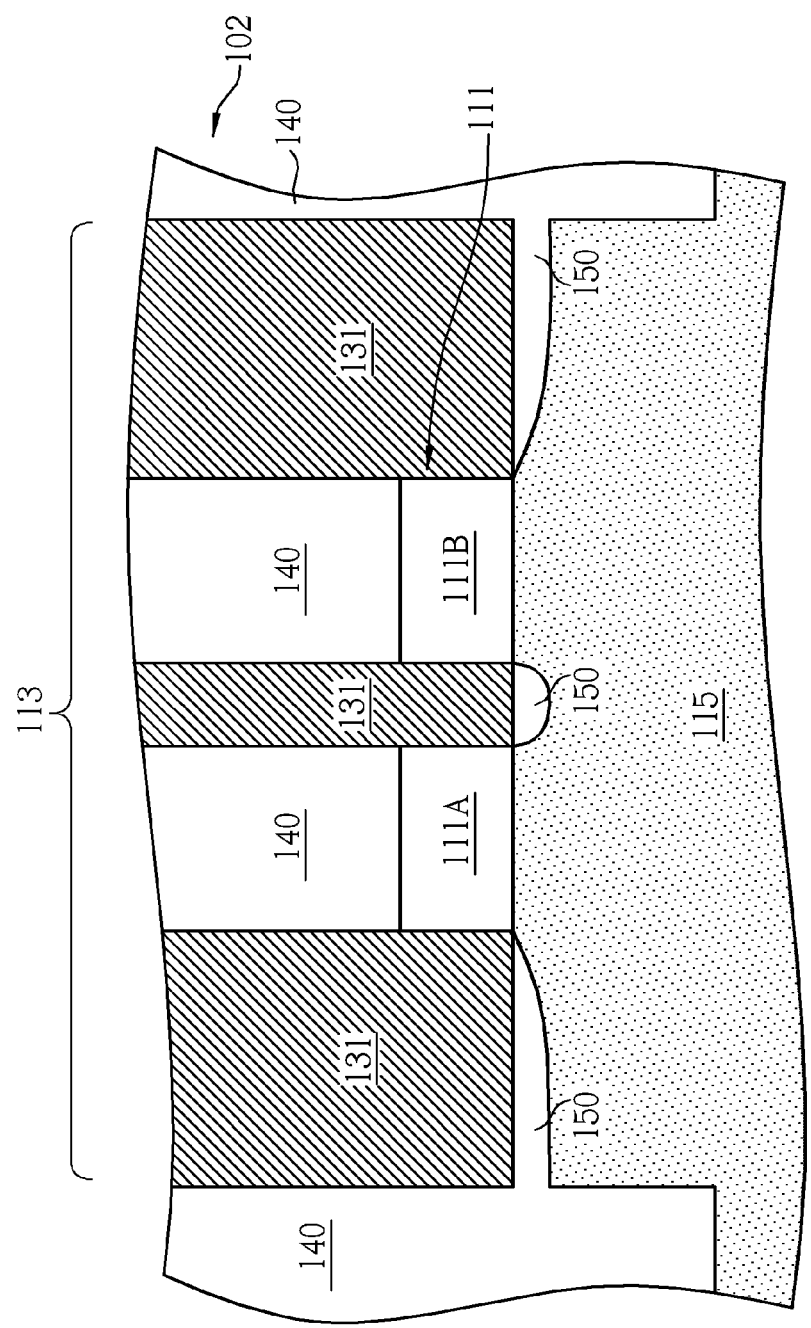

Please refer to FIG. 5. FIG. 5 illustrates a second staining procedure being carried out to reveal the junction profile. The second staining procedure is focused on selectively staining the doped substrate region 112/112A/112B to form a second void 150. The first void 140 and the second void 150 may connect to each other.

The second staining procedure may employ a chemical solution that has an oxidizing agent. For example, the second staining procedure may employ a chemical solution which contains HF, $HNO_3$ and $CH_3COOH$. Moreover, the second staining procedure may be carried out under a controlled condition to control the staining rate and to develop a good stain profile. For example, the second staining procedure is carried out at room temperature, around 0° C. and/or in the presence of light.

After the second staining procedure, a sample cross-section is obtained from sampling the test device 101, as shown in FIG. 5. The sample cross-section shows a substrate region 115, an active area 113, a first void 140 and a second void 150. The active area 113 is disposed on the substrate region 115. At least one gate 111A/111B is disposed on the active area 113. There are two voids which can be observed from the sample cross-section. The first void 140 is recessed in the substrate region 115 and surrounds the active area 113. The second void 150 is recessed in the active area 113 and surrounds the gate 111A/111B. Moreover, the metal connection 131 electrically connects to the gate 111A/111B and is surrounded by the first void 140 and the second void 150.

Figure 6:
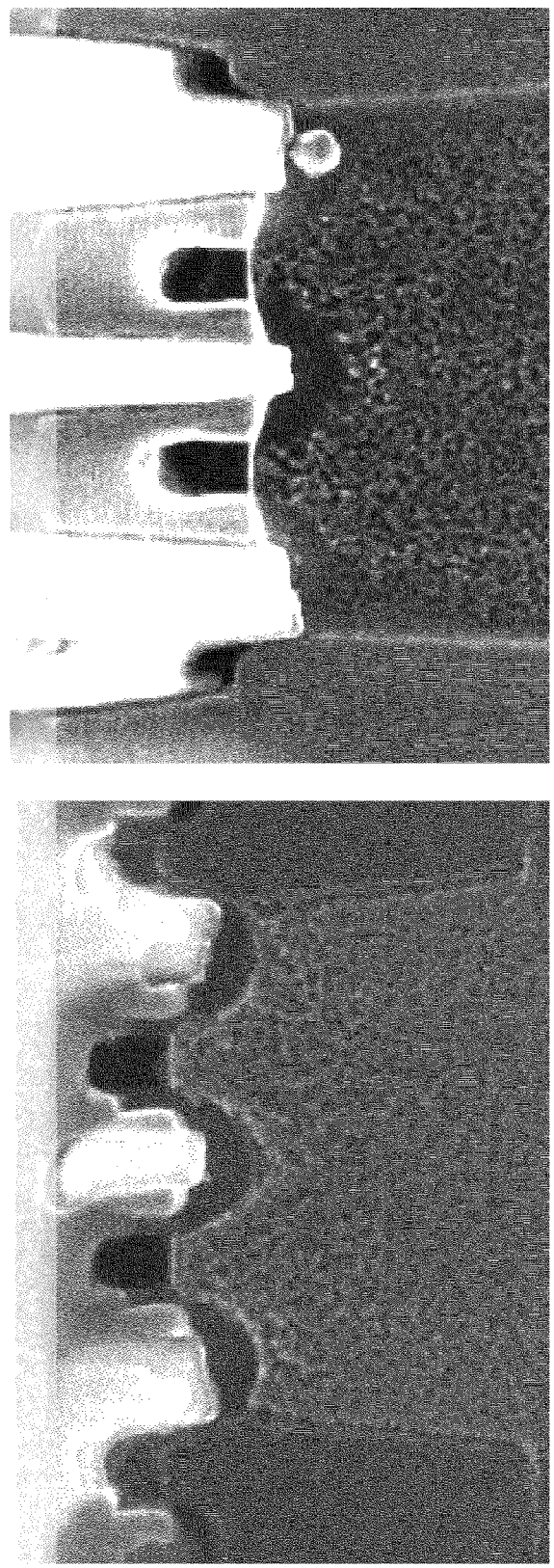
FIG. 6 shows the image of the method of the present invention and the image of the conventional method.

Once the junction profile of the sample 102 is well revealed, an inspection procedure can be carried out to examine the first profile of the first doped substrate region 112A, the second profile of said second doped substrate region 112B and the profile between the gates 111A/111B. The results are shown in FIG. 6. The picture on the left shows the image of the method of the present invention, and the picture on the right shows the image of the conventional method. Since the method of the present invention takes the advantages of a first staining procedure and a second staining procedure to help the sample 102 develop a good junction profile as shown in FIG. 6, the inspection procedure can be much more easily carried out to examine the junction profile and to obtain a correct result as expected.

Those skilled in the art will readily observe that numerous modifications and alterations of the device and method may be made while retaining the teachings of the invention.

What is claimed is:

1. A method for staining a sample, comprising:
   providing a test device;
   sampling said test device to obtain a sample, said sample comprising:
      a substrate;
      an exposed shallow trench isolation embedded in said substrate; and
      an active area disposed within said exposed shallow trench isolation and comprising a first doped substrate region and a second doped substrate region, wherein at least one gate is disposed between said first doped substrate region and said second doped substrate region;
   performing a first staining procedure to selectively remove said shallow trench isolation to entirely expose said active area; and
   performing a second staining procedure to selectively stain said first doped substrate region and said second doped substrate region.

2. The method of claim 1, further comprising:
   performing an inspection procedure to examine the first profile of said first doped substrate region and the second profile of said second doped substrate region.

3. The method of claim 1, wherein sampling of said test device is carried out by an ion beam.

4. The method of claim 1, wherein sampling of said test device is carried out by polishing said test device.

5. The method of claim 1, wherein sampling of said test device is carried out by cleaving said test device.

6. The method of claim 1, wherein sampling of said test device exposes said active area of said sample.

7. The method of claim 1, wherein said sample comprises a metal connection electrically connected to said gate.

8. The method of claim 1, wherein said sample further comprises a dielectric layer covering said active area, said first doped substrate region, said second doped substrate region and said shallow trench isolation.

9. The method of claim 8, wherein said first staining procedure removes said dielectric layer and said shallow trench isolation to form a first void surrounding said active area.

10. The method of claim 1, wherein said first staining procedure is carried out by using a fluoro-containing etchant.

11. The method of claim 1, wherein said shallow trench isolation entirely surrounds said active area.

12. The method of claim 1, wherein said second staining procedure is carried out at room temperature.

13. The method of claim 1, wherein said second staining procedure is carried out at 0° C.

14. The method of claim 1, wherein said second staining procedure is carried out in the presence of light.

15. The method of claim 1, wherein said sample comprises a PMOS.

* * * * *